United States Patent [19]

McMorrow, Jr. et al.

[11] Patent Number: 5,041,794
[45] Date of Patent: Aug. 20, 1991

[54] VOLTAGE TO CURRENT CONVERSION SWITCHING SYSTEM

[75] Inventors: Richard H. McMorrow, Jr., Lincoln; Hans J. Weedon, Salem, both of Mass.

[73] Assignee: Analogic Corporation, Peabody, Mass.

[21] Appl. No.: 616,436

[22] Filed: Nov. 21, 1990

[51] Int. Cl.$^5$ ............................................... H03F 3/68
[52] U.S. Cl. ..................................... 330/51; 307/242; 328/96; 330/289; 330/295
[58] Field of Search ...................... 330/51, 124 R, 289, 330/295; 307/242; 328/96

[56] References Cited

U.S. PATENT DOCUMENTS 4,393,371  7/1983  Morgan-Smith ..................... 328/151

Primary Examiner—James B. Mullins
Attorney, Agent, or Firm—Iandiorio & Dingman

[57] ABSTRACT

A voltage to current conversion switching system includes an input terminal for receiving input signal voltage to be converted to a current; an output terminal; a first, positive channel having a first offset amplifier for introducing a positive offset to the input signal; a first voltage to current amplifier responsive to the first offset amplifier; and first switching means responsive to the first voltage to current amplifier to provide a first offset current signal to the output terminal; a second, negative channel has a second offset amplifier for introducing a negative offset to the input signal; a second voltage to current amplifier responsive to the second offset amplifier; and second switching means responsive to the second voltage to current amplifier to provide a second equal and opposite offset current signal to the output terminal to compensate for the temperature drift and switching current injection in the first and second offset current signals; and drive means for actuating the first and second switch means simultaneously to open and close and periodically combine the first and second offset current signals to produce an output current compensated for temperature drift and switching current injection.

4 Claims, 5 Drawing Sheets

VOLTAGE TO CURRENT CONVERSION SWITCHING SYSTEM

FIELD OF INVENTION

This invention relates to a voltage to current conversion switching system, and more particularly to such a system which uses complementary channels to offset drift and switching current effects and charge injection and further to such a system which adjusts the current output to maintain a constant output charge independent of switching period durations.

BACKGROUND OF INVENTION

In high speed applications such as analog to digital conversion in image processing systems, it is often necessary to produce a current from a voltage such that the current is precisely proportional to the voltage despite drift due to time and temperature and distortion due to switching currents interfering with the switched current. These problems are especially serious when the switching times are in the picosecond range to provide integration conversions in the nanosecond range.

A further problem occurs when the integration window must be capable of being varied over a wide range, for example from 6 to 48 nanoseconds: at shorter durations, less charge is accumulated and so a lower voltage is applied to the A/D converter so that the whole input range of the A/D converter is not fully utilized.

SUMMARY OF INVENTION

It is therefore an object of this invention to provide an improved voltage to current conversion switching system.

It is a further object of this invention to provide such a voltage to current conversion switching system capable of high speed switching in the picosecond range.

It is a further object of this invention to provide such a voltage to current conversion switching system which is precise and reliable even at high speeds.

It is a further object of this invention to provide such a voltage to current conversion switching system which virtually eliminates time and temperature drift effects.

It is a further object of this invention to provide such a voltage to current conversion switching system which virtually eliminates switching charge injection effects.

It is a further object of this invention to provide such a voltage to current conversion switching system maintains the same dynamic range of charge (current/time) output over a wide range of charging times.

The invention results from the realization that a truly effective high speed, reliable and accurate voltage to current switching system can be achieved by submitting the input voltage signal to two matched channels, one of which adds a positive offset and other of which adds a negative offset, converting them to currents and then recombining the resultant current to cancel any temperature drift and switching current injection effects, and from the further realization that the charge output of the system can be held constant independent of the switching period by adjusting the gain as a function of switching period so that the total charge is always held constant.

This invention features a voltage to current conversion switching system including an input terminal for receiving an input signal voltage to be converted to a current and an output terminal. There is a first, positive channel having a first offset amplifier for introducing a positive offset to the input signal, a first voltage to current amplifier responsive to the first offset amplifier, and first switching means responsive to the first voltage to current amplifier to provide a first offset current signal to the output terminal. There is a second, negative channel having a second offset amplifier for introducing a negative offset to the input signal, a second voltage to current amplifier responsive to the second offset amplifier, and second switching means responsive to the second voltage to current amplifier to provide a second equal and opposite offset current signal to the output terminal to compensate for the temperature drift and switching current injection in the first and second offset current signals. There are means for actuating the first and second switch means simultaneously to open and close and periodically combine the first and second offset current signals to produce an output current compensating for temperature drift and switching current injection.

In a preferred embodiment the system includes first and second shunt switching means connected in series between the first and second voltage to current amplifiers for shunting the first and second offset current signal when the first and second switching means are switched off to maintain current flow in the system even when no current is provided to the output terminal. Each of the voltage to current amplifiers include gain adjusting means responsive to the means for actuating to adjust the gain to maintain at a predetermined level the charge provided by the output current.

The invention also features a voltage to charge conversion switching system including an input terminal for receiving an input signal voltage to be converted to a current, and an output terminal. A positive channel has a first offset amplifier for introducing a positive offset to the input terminal, a first voltage to current amplifier responsive to the first offset amplifier, and a first switching means responsive to the first voltage to current amplifier to provide a first offset current signal to the output terminal. The second negative channel has a second offset amplifier for introducing a negative offset to the input signal, a second voltage to current amplifier responsive to the second offset amplifier, and second switching means responsive to the second voltage to current amplifier to provide a second, equal and opposite offset current signal to the output terminal to compensate for the temperature drift and switching current injection in the first and second offset current signals.

There are means for timing the actuation of the first and second switching means simultaneously to periodically combine the first and second offset current signals to provide an output charge compensated for temperature drift and switching current injection, and to maintain the output charge at a predetermined level independent of the timing of the actuation of the switch means.

DISCLOSURE OF PREFERRED EMBODIMENT

Other objects, features and advantages will occur to those skilled in the art from the following description of a preferred embodiment and the accompanying drawings, in which.

Figure 1:
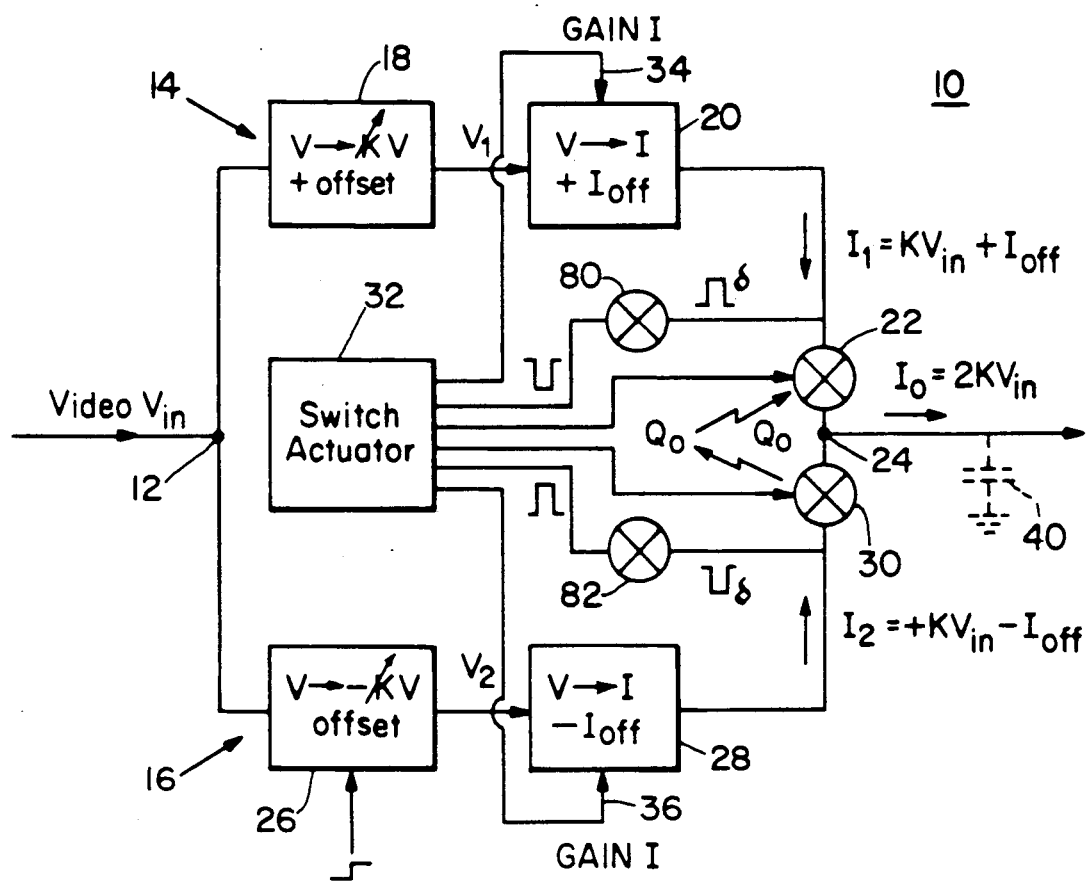
FIG. 1 is a block diagram of a voltage to current conversion switching system according to this invention.

There is shown in FIG. 1 a voltage to current conversion switching system 10 which includes an input terminal 12 for receiving an input signal voltage such as a video signal $V_{in}$. $V_{in}$ is directed then to two channels, a first or positive channel 14, and a second or negative channel 16. Positive channel 14 includes an offset amplifier 18 which introduces a fixed positive offset, for example two volts in the instance where $V_{in}$ is an approximately 1 volt video signal. From offset amplifier 18 the offset voltage $V_1$ is delivered to a voltage to current amplifier 20. The output of amplifier 20, of current $I_1$, is proportional to $V_{in}$ and the current offset. This is delivered to switch 22, which may be implemented for example by a high-speed switching transistor. The output of switch 22 is delivered to output terminal 24.

The second, negative channel 16 includes a second offset amplifier 26 which provides a negative 2-volt offset to the incoming positive voltage $V_{in}$, resulting in a voltage $V_2$ This voltage is delivered to voltage to current amplifier 28, which in turn delivers to switch 30 a second offset current $I_2$, which is proportional to $V_{in}$. Switches 22 and 30 can be implemented by high-speed transistors. Switches 22 and 30 are operated by switch actuator 32, which may be driven from control logic to control an A/D converter which is fed from output 24, or any other suitable timing means which achieves the desired switching cycles.

The use of two matched complementary channels 14 and 16 accomplishes a number of beneficial results for system 10. First, any temperature drift which occurs in one channel will be offset by an equal and opposite change in the other channel, thereby compensating for the temperature effects. In addition, any switching currents which are interjected into $I_1$ and $I_2$ by switches 22 and 30 will be equal and opposite, thereby offsetting those switching currents. Thus two of the primary problems with high-speed switching circuits are addressed by the configuration of system 10. This approach of course assumes that amplifiers 18 and 26, and 20 and 28, and switches 22 and 30, in each channel are matched components or have matched characteristics.

System 10 has an added feature: it is capable of maintaining a constant charge at output terminal 24, regardless of the length of the switching cycle imposed by switch actuator 32 on switches 22 and 30. It accomplishes this by varying the gain over lines 34 and 36 in amplifiers 20 and 28 so that as the switching time increases the gain decreases, and conversely as the switching time decreases the gain increases, so that the amount of charge which appears at output terminal 24 for a given period of time, for example to charge a capacitor 40, is always the same. Thus a capacitor such as 40 would always reach the same voltage.

Figure 2:
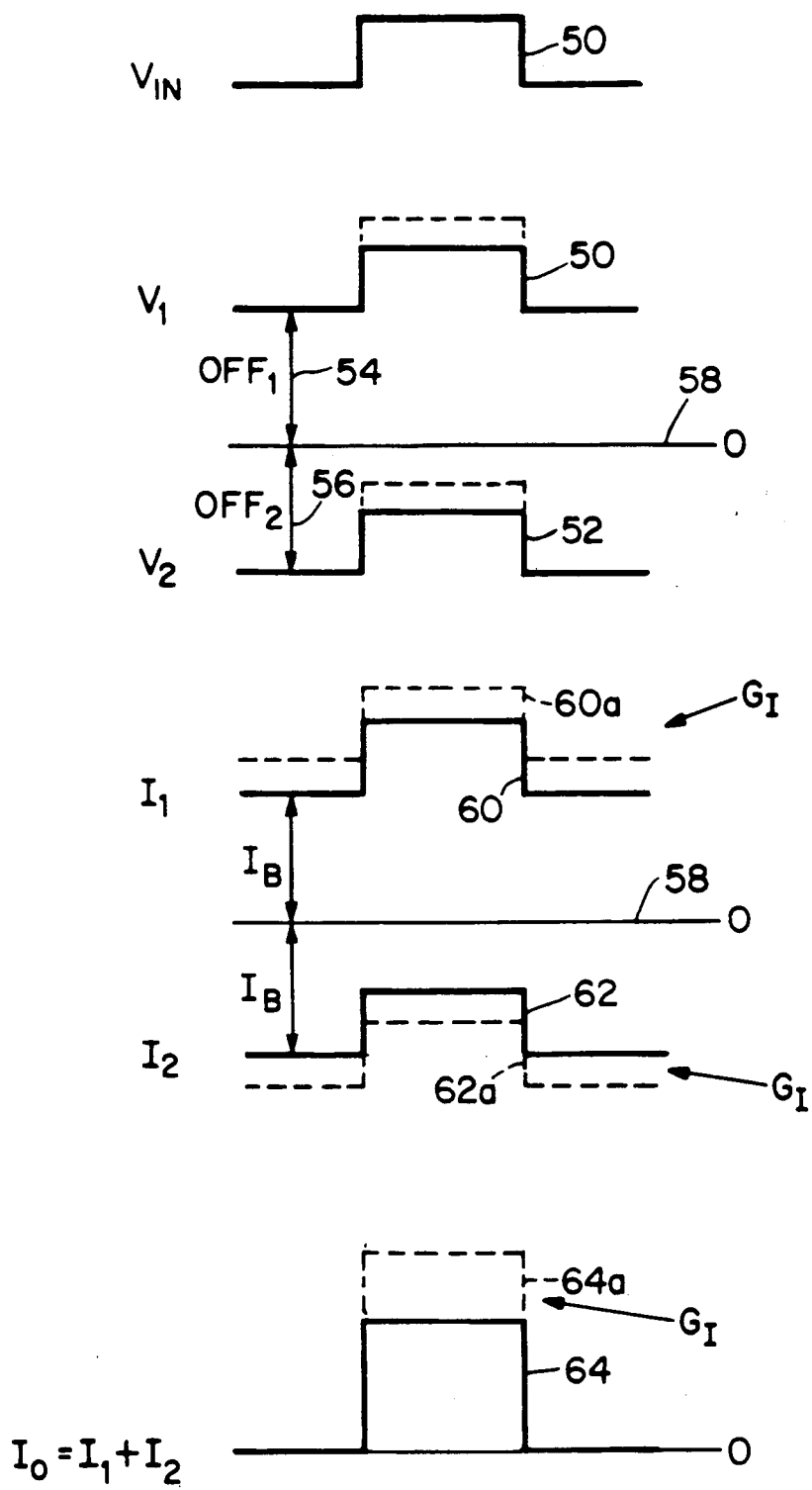
FIG. 2 is an illustration of a number of the waveforms which occur in FIG. 1.

This may be better understood with reference to FIG. 2, where it can be seen the $V_1$ 50 and $V_2$ 52 have the same period as $V_{in}$ 50, but they have been offset by the amounts 54, 56 from ground or common 58. Offset current $I_1$ 60, and $I_2$ 62, are shifted above and below ground 58 in equal amounts in the same manner as $V_1$ and $V_2$. In addition, any variation in gain over lines 34 and 36 causes the offset currents $I_1$ and $I_2$ to be shifted as indicated in phantom at 60a and 62a as a result of the adjustment in the gain $G_1$. When the currents $I_1$ and $I_2$ are combined at terminal 24 by the operation of switches 22 and 30, the resulting current $I_O$ 64 is a combination of both currents $I_1$ and $I_2$ plus the modification made by the gain 64a.

Figure 3:
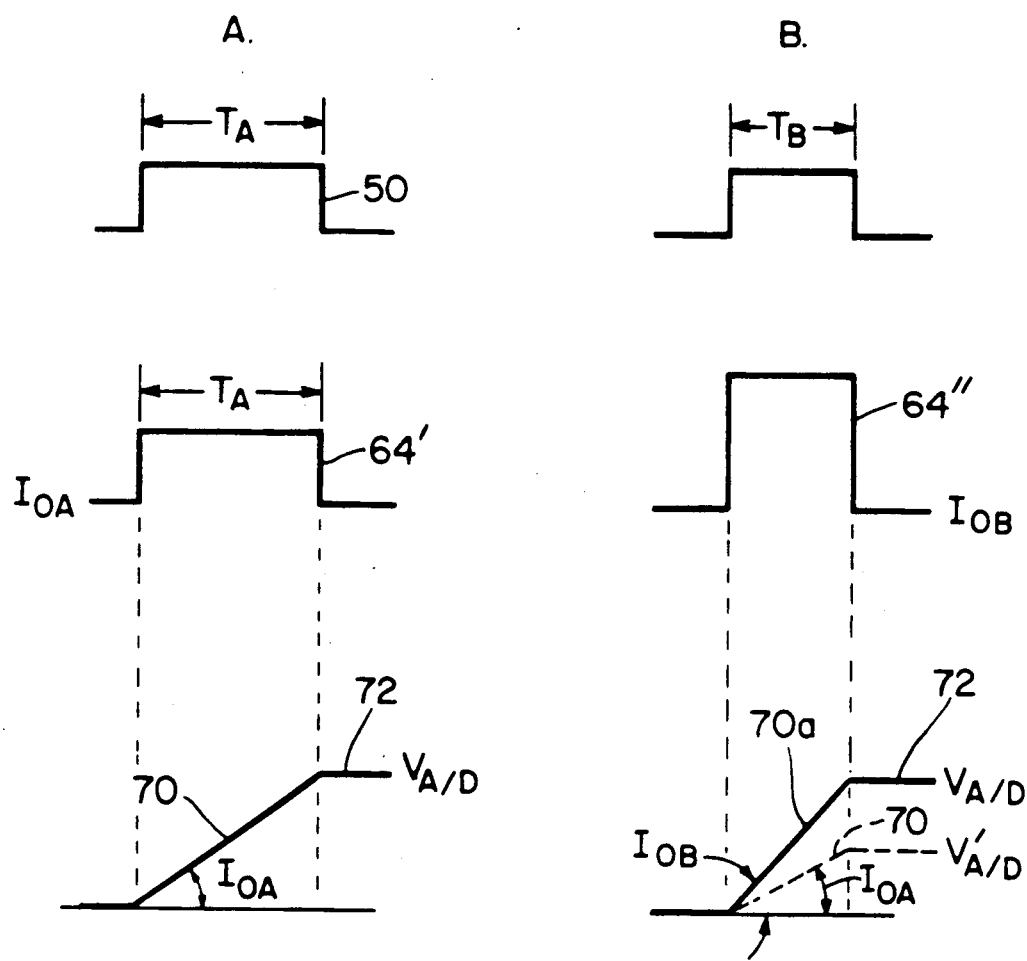
FIG. 3 is a depiction of two sets of waveforms which illustrate the constant charge output achievable according to one aspect of this invention.

The effect of the gain in keeping the output charge constant can be better understood with reference to FIG. 3, where in a first case the voltage in 50 has a duration $T_A$ resulting in an output current $I_{OA}$ 64' having the same duration $T_A$. In that case, capacitor 40 charges along the ramp 70 to reach a voltage 72 $V_{AD}$. In contrast, case B, where the $V_{in}$ pulse $T_B$ is substantially shorter, the output current 64'', $I_{OB}$, would also have a shorter duration $T_B$. In that case the ramp 70a would be steepened by the increase in gain to achieve the same voltage level 72, $V_{AD}$ (inversely proportional), by the end of the cycle. If the gain were not increased to increase the slope as shown at 70a and the original gain were used, then the ramp 70 would occur and this would result in the final output voltage $V_{AD}'$, which would be a much lower voltage and cause a much lower charge to accumulate in capacitor 40. This would cause a mismatch with the dynamic range of the subsequent equipment such as an A/D converter connected to output terminal 24.

Referring again to FIG. 1, a second set of switches 80, 82 may be connected in series with amplifiers 20 and 28, shunting switches 22 and 30. Switches 80 and 82 are also operated by switch actuator circuit 32 alternately with switches 22 and 30, so that when switches 22 and 30 are on, switches 80 and 82 are off, and conversely. This is done so that there will always be present the current flow $I_1$ and $I_2$ in the system. Thus when switches 22 and 30 are turned on the current will be instantly present rather than requiring a buildup time. With switches 22 and 30 off, capacitor 40 can be used to "hold" charge as in an integrate and hold system or be reset for the next cycle.

Figure 4:
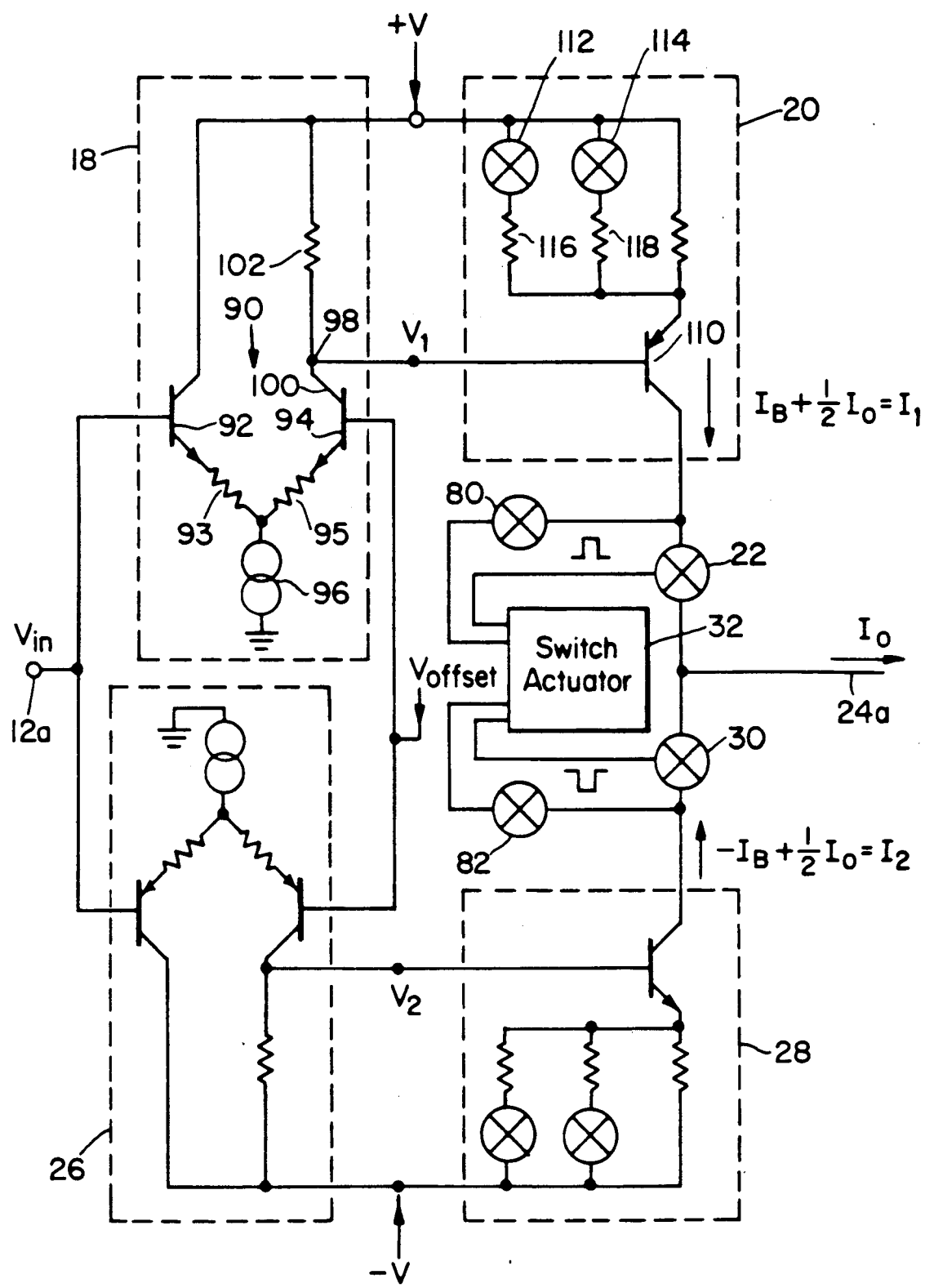
FIG. 4 is a more detailed schematic of the system of FIG. 1 for operation at high speeds in the picosecond range.

In a high-speed switching circuit operating in the picosecond range, amplifiers 18 and 26 may be implemented as shown in FIG. 4, with specific reference to amplifier 18, which includes a differentially connected transistor pair 90 composed of two transistors 92 and 94 with their emitters connected through resistors 93 and 95 to current source 96. Resistors 93 and 95 set the signal gain of differential pair amplifier 90. The output 98 of differential pair 90 occurs at the junction of collector 100 of transistor 94 and resistor 102, which is connected to the V+ power supply. The difference between the power supply voltage +V and voltage $V_1$ at output terminal 98 represents the offset which is introduced by amplifier 18. Voltage to current amplifier 20 includes transistor 110 and one or more switching transistors 112, 114 connected in series with resistors 116 and 118 between the +V power supply and the emitter of transistor 110. Switches 112, 114 may be any form of switches connected in series with resistors 116 and 118 between +V power supply and the emitter of transistor 110. By selectively operating one of the switching devices 112 or 114, one of the resistors 116, 118 is placed in series between the +V power supply and the emitter of transistor 110, and in this way the gain of the voltage to current converter 20 may be adjusted in order to maintain a constant charge delivery to output terminal 24a. Offset amplifier 26 is constructed similarly to offset amplifier 18 and voltage to current amplifier 28 is constructed similarly to voltage to current converter 20.

Figure 5:
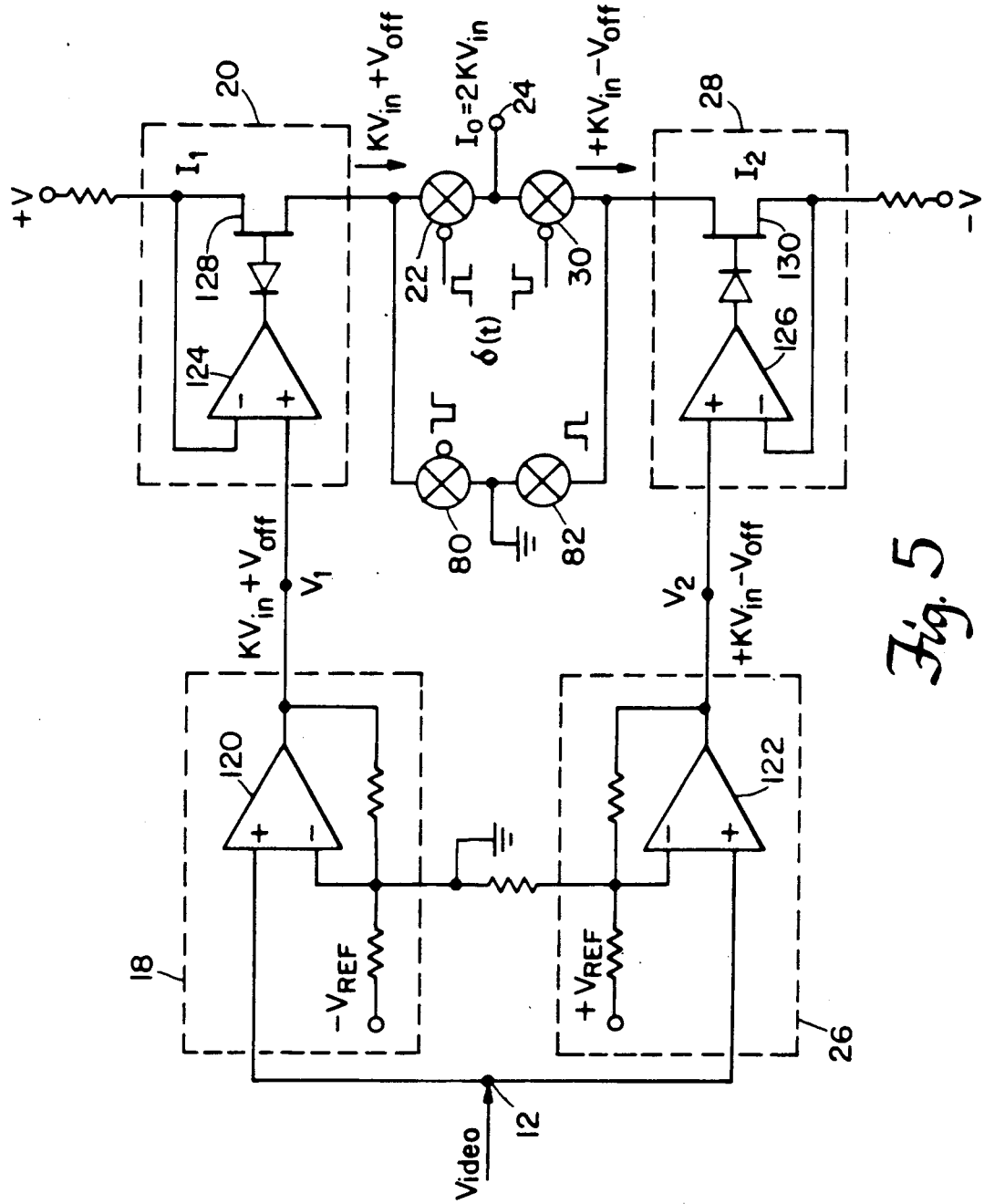
FIG. 5 is a more detailed schematic of the system of FIG. 1 implemented for use in the lower speed range such as 50 nanoseconds.

An alternative embodiment, useful at lower speeds in the 50 nanosecond range, is as shown in FIG. 5, where op amp 120 and 122 have been used to implement offset amplifiers 18 and 26, respectively, and op amps 124 and 126 in conjunction with FETs 128 and 130 have been used to implement voltage to current converter circuits 20 and 28, respectively.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A voltage to current conversion switching system comprising:

an input terminal for receiving an input signal voltage to be converted to a current;

an output terminal;

a positive channel having a first offset amplifier for introducing a positive offset to said input signal; a first voltage to current amplifier responsive to said first offset amplifier; and first switching means, responsive to said first voltage to current amplifier, to provide a first offset current signal to said output terminal;

a negative channel having a second offset amplifier for introducing a negative offset to said input signal; a second voltage to current amplifier responsive to said second offset amplifier; and second switching means responsive to said second voltage to current amplifier to provide a second equal and opposite offset current signal to said output terminal to compensate for the temperature drift and switching current injection in the first and second offset current signals; and means for actuating said first and second switch means simultaneously to open and close and periodically combine said first and second offset current signals to form an output current compensated for temperature drift and switching current injection.

2. The voltage to current conversion switching system of claim 1 further including first and second shunt switching means connected in series between said first and second voltage to current amplifiers for shunting said first and second offset current signals when said first and second switching means are switched off to maintain current flow in said system even when no current is provide to said output terminal.

3. The voltage to current conversion switching system of claim 1 in which each said voltage to current amplifier includes gain adjusting means, responsive to said means for actuating, to adjust the gain to maintain at a predetermined level the charge provided by said output current.

4. A voltage to charge conversion switching system comprising:

an input terminal for receiving an input signal voltage to be converted to a current;

an output terminal;

a positive channel having a first offset amplifier for introducing a positive offset to said input signal; a first voltage to current amplifier responsive to said first offset amplifier; and first switching means, responsive to said first voltage to current amplifier, to provide a first offset current signal to said output terminal;

a negative channel having a second offset amplifier for introducing a negative offset to said input signal; a second voltage to current amplifier responsive to said second offset amplifier; and second switching means responsive to said second voltage to current amplifier to provide a second equal and opposite offset current signal to said output terminal to compensate for the temperature drift and switching current injection in the first and second offset current signals; and means for actuating said first and second switch means simultaneously periodically combine said first and second offset current signals to produce an output charge compensated for temperature drift and switching current injection and to maintain the output charge at a predetermined level independent of the timing of the actuation of said switch means.

* * * * *